(12) United States Patent
Kamins

(10) Patent No.: US 8,148,800 B2
(45) Date of Patent: Apr. 3, 2012

(54) NANOWIRE-BASED SEMICONDUCTOR DEVICE AND METHOD EMPLOYING REMOVAL OF RESIDUAL CARRIERS

(75) Inventor: Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 136 days.

(21) Appl. No.: 12/243,182

(22) Filed: Oct. 1, 2008

(65) Prior Publication Data

US 2009/0179192 A1    Jul. 16, 2009

Related U.S. Application Data

(60) Provisional application No. 61/020,469, filed on Jan. 11, 2008.

(51) Int. Cl.
*H01L 29/93* (2006.01)

(52) U.S. Cl. .......... 257/600; 257/E29.07; 438/379

(58) Field of Classification Search .......... 977/762, 977/938; 257/600, E29.07; 438/379
See application file for complete search history.

(56) References Cited

U.S. PATENT DOCUMENTS

| | | | |
|---|---|---|---|
| 5,757,036 A * | 5/1998 | Temple | 257/147 |
| 7,115,971 B2 * | 10/2006 | Stumbo et al. | 257/600 |
| 7,135,728 B2 | 11/2006 | Duan et al. | |
| 7,254,151 B2 * | 8/2007 | Lieber et al. | 372/44.01 |
| 7,339,186 B2 * | 3/2008 | Mio et al. | 257/14 |
| 7,633,081 B2 * | 12/2009 | Bakkers et al. | 257/13 |
| 2005/0006673 A1 * | 1/2005 | Samuelson et al. | 257/232 |
| 2005/0176228 A1 * | 8/2005 | Fonash et al. | 438/597 |
| 2006/0237537 A1 * | 10/2006 | Empedocles et al. | 235/439 |
| 2006/0273328 A1 | 12/2006 | Niu et al. | |
| 2007/0155025 A1 | 7/2007 | Zhang et al. | |
| 2007/0164270 A1 | 7/2007 | Majumbar et al. | |
| 2009/0267049 A1 * | 10/2009 | Cho et al. | 257/13 |

FOREIGN PATENT DOCUMENTS

WO    WO 2004102684 A2 * 11/2004

* cited by examiner

*Primary Examiner* — Thao Le
*Assistant Examiner* — William F Kraig

(57) ABSTRACT

A nanowire-based device and method employ removal of residual carriers. The nanowire-based device includes a semiconductor nanowire having a semiconductor junction, and a residual carrier sink. The residual carrier sink is located at or adjacent to the semiconductor nanowire near the semiconductor junction and employs one or both of enhanced recombination and direct extraction of the residual carriers. The method includes providing a semiconductor nanowire, forming a semiconductor junction within the semiconductor nanowire, forming a residual carrier sink, and removing residual carriers from the semiconductor junction region using the residual carrier sink.

20 Claims, 3 Drawing Sheets

NANOWIRE-BASED SEMICONDUCTOR DEVICE AND METHOD EMPLOYING REMOVAL OF RESIDUAL CARRIERS

CROSS-REFERENCE TO RELATED APPLICATION

The present application claims priority from provisional application Ser. No. 61/020,469, filed Jan. 11, 2008, the contents of which are incorporated herein by reference in their entirety.

STATEMENT REGARDING FEDERALLY SPONSORED RESEARCH OR DEVELOPMENT

N/A

BACKGROUND

1. Technical Field

The invention relates to semiconductor devices. In particular, the invention relates to semiconductor devices having a semiconductor junction.

2. Description of Related Art

Semiconductor devices that have need of high switching speeds are being employed in an increasing number of subsytems and systems. Among such high switching speed semiconductor devices are high-frequency electrical components (e.g., microwave and radio frequency switches and amplifying devices), signal emitters (e.g., light emitting diodes or 'LEDs', semiconductor lasers, etc.), optical modulators, and signal detectors (e.g., optical detectors, etc.). In recent years, semiconductor devices comprising nanowires have been developed. In particular, semiconductor nanowires that incorporate an integral semiconductor junction have been demonstrated. Nanowire-based semiconductor devices such as LEDs and semiconductor lasers have been realized using such semiconductor nanowires. Similarly, devices such as diodes and detectors including, but not limited to, optical detectors, have been fabricated using semiconductor nanowires with integral junctions. Such semiconductor devices that employ a semiconductor nanowire, either singly or in a plurality, may be attractive for use in a wide variety of applications.

A switching speed or a modulation rate of semiconductor nanowire-based devices may be limited by the presence of residual carriers that remain in or near the semiconductor junction when the device is turned off. Efforts to overcome this limitation have included decreasing a carrier lifetime in a vicinity of the semiconductor junction. Unfortunately decreasing the carrier lifetime also tends to decrease an efficient of the semiconductor device. As such, there is a keen interest in developing a means for effectively removing residual carriers without significantly adversely affecting device performance and efficiency. Moreover, such means for residual carrier removal that applies to nanowire-based semiconductor junction devices would satisfy a long felt need.

BRIEF SUMMARY

In some embodiments of the present invention, a nanowire-based device is provided. The nanowire-based device comprises a semiconductor nanowire having a semiconductor junction. The nanowire-based device further comprises a residual carrier sink. The residual carrier sink is adjacent to a surface of the nanowire proximal to the semiconductor junction. The residual carrier sink facilitates removal of residual carriers from the semiconductor junction using one or both enhanced recombination and direct extraction of residual carriers.

In other embodiments of the present invention, a nanowire-based device is provided. The nanowire-based device comprises a nanowire comprising a semiconductor material. The semiconductor material comprises a plurality of dopants that forms a semiconductor junction, the semiconductor junction being axially located within the nanowire. The nanowire-based device further comprises a residual carrier sink proximal to the semiconductor junction. The residual carrier sink comprises a region of the nanowire either at or adjacent to a surface of the nanowire, the region having enhanced state density relative to a state density of the semiconductor material of the nanowire outside of the region. The residual carrier sink facilitates removal of residual carriers from the semiconductor junction.

In other embodiments of the present invention, a method of residual carrier removal in a nanowire-based device is provided. The method of residual carrier removal comprises providing a semiconductor nanowire and forming a semiconductor junction within the semiconductor nanowire. The method of residual carrier removal further comprises forming a residual carrier sink proximal to the semiconductor junction adjacent to a surface of the semiconductor nanowire. The method further comprises removing residual carriers from the semiconductor junction using the residual carrier sink. Removing residual carriers using the residual carrier sink employs one or both of enhanced recombination and biased residual carrier extraction.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
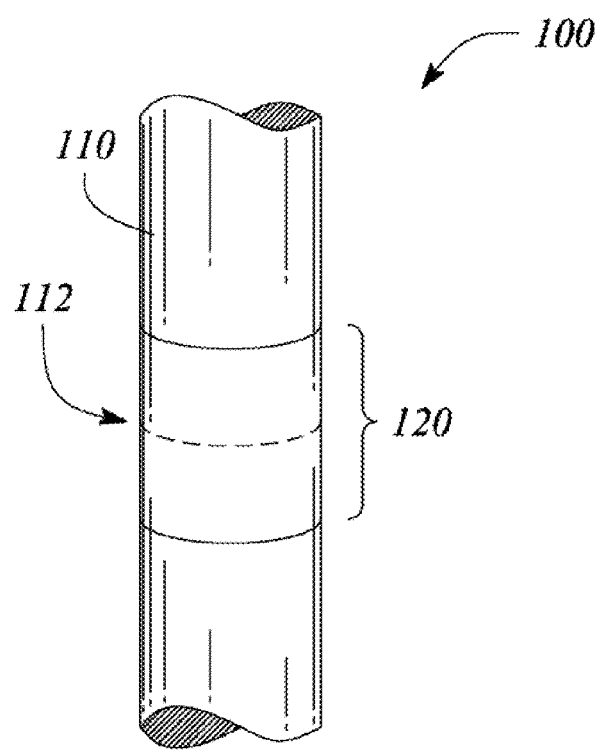
FIG. 1 illustrates a side view of a nanowire-based device according to an embodiment of the present invention.

Embodiments of the present invention facilitate removal of residual carriers from a region of a semiconductor junction of a nanowire-based device. In particular, residual carriers are removed from an active region of the semiconductor junction. According to various embodiments, the residual carrier removal is provided by a residual carrier sink. The present invention applies to residual carrier removal from nanowire-based devices including, but not limited to, photonic devices as well as essentially non-photonic, electronic devices.

Examples of photonic devices include, but are not limited to light emitting diodes (LEDs), semiconductor lasers, and optical detectors and modulators. Exemplary non-photonic, electronic devices include, but are not limited to, diode junctions used as electronic signal detectors, switches, amplifiers, and modulators. While sometimes described herein with respect to photonic device for simplicity of discussion, unless otherwise specifically noted, the discussion herein broadly applies to both photonic and non-photonic devices.

The residual carrier sink is generally located at or adjacent to a surface of a nanowire of the nanowire-based device proximal to the semiconductor junction. By 'surface' it is meant a primary surface or boundary of a semiconductor material of the nanowire. The primary surface or boundary separates the semiconductor material of the active region from other materials of the nanowire that may surround the active region providing material. For example, the nanowire may comprise a plurality of layers in a core/shell structure (e.g., a shell comprising an oxide coating on a semiconductor core). The core comprises a semiconductor material that provides the active region. Thus, the surface of the nanowire is the surface of the exemplary core, according to the present invention.

The removal of residual carriers may increase an effective switching speed or modulation rate of the nanowire-based device, in some embodiments. For example, the residual carrier removal may reduce or essentially minimize an effect that the residual carriers have on an operational decay characteristic of the device after a stimulus condition is removed or switched off.

According to some embodiments, the residual carrier sink removes residual carriers from the semiconductor junction by enhancing recombination at or near a surface of the nanowire. In some embodiments, the enhanced recombination is essentially non-radiative recombination such as, but not limited to, Auger recombination. In other embodiments, the enhanced recombination may include fast radiative recombination instead of or in addition to non-radiative recombination. By removing residual carriers using enhanced recombination at or near the surface of the nanowire, an efficiency of the nanowire-based device is not significantly adversely affected by the residual carrier sink.

Specifically, in some embodiments, the residual carrier sink removes residual carriers by increasing a surface recombination velocity. The residual carrier sink provides an enhanced surface/interface state density proximal to the semiconductor junction. In other embodiments, the residual carrier sink removes residual carriers using recombination in a highly doped region near the surface of the nanowire proximal to the semiconductor junction. Both the enhanced surface state density and the highly doped region enhance non-radiative recombination, such as Auger recombination, to remove the residual carriers.

In other embodiments, the residual carrier sink employs direct carrier extraction to remove the residual carriers from the semiconductor junction. In these embodiments, the residual carrier sink comprises an extraction electrode that is located at a surface of the nanowire proximal to the semiconductor junction. Direct extraction of residual carriers employs an electrical bias in combination with the extraction electrode so it may also be referred to as 'biased residual carrier extraction'. The biased residual carrier extraction is time-coordinated with operation of the nanowire-based device and does not significantly adversely affect the efficiency or other operational characteristics thereof. In some embodiments, a combination of enhanced non-radiative recombination and direct extraction of residual carriers may also be employed according to some embodiments.

The removal of residual carriers by the residual carrier sink is further facilitated by a typical lateral dimension of nanowire-based device, in various embodiments. Specifically, a nanowire is often characterized by a relatively short lateral dimension which means that a distance from the active region of the semiconductor junction to a surface of the nanowire is relatively small. For example, a diameter of a typical nanowire may be on the order of 20-100 nanometers (nm). The residual carrier sink being located on or adjacent to the nanowire surface benefits from a relatively rapid diffusion of residual carriers from the active region to the surface resulting from this characteristic short lateral dimension. Herein, 'lateral dimension' refers to a distance from a center of the nanowire to a nearest surface thereof.

The embodiments of the present invention apply to nanowire-based devices that are or operate as one or more of optical emitters, optical modulators, or optical detectors. For example, the nanowire-based device may be an optical emitter such as, but not limited to, a light emitting diode or a semiconductor junction-based (i.e., diode) laser. Such optical emitters produce light (e.g., an optical output signal) from free carriers that are injected into the active region of the semiconductor junction. The injected free carriers recombine in the active region to produce photons that exit the nanowire-based device as light. The free carriers are typically injected as a bias or injection current. The injection current is generally produced by an externally applied forward bias of the semiconductor junction of the nanowire-based device.

In another example, the nanowire-based device maid be an optical detector that receives an optical input signal and produces a photocurrent in response thereto. Specifically, the optical detector absorbs photons from the optical input signal incident on the active region of the semiconductor junction of the optical detector. The absorbed photons generate free carriers in the active region of the semiconductor junction by creating hole-electron pairs, which separate into free electrons and free holes. Because of the electric field in the junction region, the free holes and free electrons (collectively free carriers) move in opposite directions away from the semiconductor junction and through the neutral region. The moving free carriers produce a current known as a photocurrent. In some cases, movement of the free holes and the free electrons away from the semiconductor junction is assisted by a reverse bias applied across the semiconductor junction.

As used herein, 'residual carriers' are generally defined as free carriers remaining in a vicinity of a semiconductor junction in excess of a steady-state density after a stimulation condition is removed/modified. For example, when the stimulation condition is a forward bias that is removed or equivalently an injection current produced thereby, the residual carriers are excess free carriers that remain after the forward bias is switched off. In another example involving modifying a forward bias, the residual carriers are free carriers in excess of the steady-state density corresponding to the new bias after the forward bias is reduced. In yet another example, residual carriers are photo-generated free carriers that remain in a vicinity, of the semiconductor junction in excess of the steady-state density corresponding to the new optical input signal after an optical input signal is either reduced or switched off. In this example, the stimulus condition is the incident optical input signal. The residual carriers are "excess" carriers above the steady-state values of the carriers in the several regions of the semiconductor junction (i.e., approximately the total number of carriers in the depletion regions and the number above the equilibrium steady-state values in the quasi-neutral regions).

Residual carriers adversely affect a switching time or modulation rate of the nanowire-based device by reducing a sharpness of a response transition of the nanowire-based device. In particular, residual carriers remaining in the active region of the semiconductor junction eventually recombine. The residual carrier recombination typically continues until the residual carriers are depleted in the active region and a rate of recombination decreases essentially exponentially with time. The residual carrier recombination adversely affects a switching time or modulation rate of an optical emitter because some of the recombination is radiative recombination. This radiative recombination, which continues after the input signal to the optical emitter is switched so off, creates an output from the optical emitter that decays essentially exponentially. A similar effect occurs when a magnitude of the input signal is reduced instead of being switched off (e.g., analog modulation of the optical emitter). The exponential output decay sets an effective minimum switching time or modulation rate for the optical emitter. According to some embodiments of the present invention, the residual carrier sink facilitates removal of the residual carriers in an essentially non-radiative manner leading to a reduction in an output decay time of the optical emitter. In other embodiments, fast radiative recombination is also present in addition to the non-radiative removal.

In another example where the nanowire-based device is an optical detector, residual carriers present in the active region may continue to contribute to the photocurrent after the optical input signal is turned off. Specifically, due to the presence of the residual carriers, the photocurrent of the photodetector tends to decay essentially exponentially when the optical signal is switched off. A similar effect occurs when an intensity of the optical input signal is reduced in intensity instead of being switched off (e.g., in an analog modulated optical input signal). The exponentially decaying photocurrent sets an effective minimum modulation rate of the optical input signal that may be detected by the optical detector. The residual carrier sink facilitates removal of the residual carriers, which may lead to an effective reduction of the photocurrent decay time of the optical detector, according to some embodiments of the present invention.

In another example, the nanowire-based device is an optical modulator. The optical modulator modulates an optical signal passing through or near the semiconductor junction of the nanowire-based device according to an externally applied electrical signal. Specifically, changing a level of the applied electrical signal changes an effect that the modulator has on the optical signal passing therethrough. For example, the applied electrical signal may create free carriers within the junction that absorb, scatter or disperse the optical signal to produce the effect. An amount of the change in the effect on the optical signal of the free carriers depends on the change in the level of the applied electrical signal, for example. Residual carriers formed in the semiconductor junction as a result of applying the electrical signal may limit an effective maximum modulation rate of the optical modulator. The residual carrier sink facilitates removal of the residual carriers, which may lead to an effective increase in the maximum modulation rate of the optical modulator, according to some embodiments of the present invention.

As used herein, the 'active region' of the semiconductor junction is defined as that portion of the junction that actively participates in the intended operation of the semiconductor junction. For example, the active region of a semiconductor junction in an optical emitter is that portion of the junction that generates a majority of the photons produced by the optical emitter. Similarly, the active region of the semiconductor junction in an optical detector is that portion of the semiconductor junction that produces a majority of the carriers that make up the photocurrent arising from incident photons absorbed by the semiconductor material. In some embodiments, the 'active region' is defined as comprising the sum of a depletion region thickness plus a distance equal to a few minority carrier diffusion lengths away from or around the semiconductor junction into the surrounding neutral regions.

Further, as used herein a nanowire-based device is 'switched off' when a stimulus condition for that nanowire-based device is removed or otherwise turned off. For example, an optical emitter is said to be 'switched off' when the forward bias used to turn on the optical emitter is removed. Switching off an optical detector occurs when the optical input signal incident on the optical detector is switched off irrespective of a condition of any reverse bias that may be applied to the optical detector.

The term 'nanowire' as employed herein is defined as an individual quasi-one dimensional, nano-scale, often single crystalline structure typically characterized as having two spatial dimensions or directions that are much less than a third spatial dimension or direction. The presence of the third, greater dimension in nanowires facilitates electron transport along that dimension while conduction is limited in the other two spatial dimensions. Moreover, a nanowire, as defined herein, generally has an axial dimension or length (as a major or third spatial dimension), opposite ends and a solid core. For example, the axial length of a nanowire is typically many times that of a diameter, or equivalently of a width, of the nanowire. A nanowire also may be referred to as a nanowhisker, nanorod or a nanoneedle. A 'semiconductor nanowire' is a nanowire comprising a semiconductor material.

Nanowires may be formed according to a variety of methodologies. For example, nanowires may be formed by filling a mold comprising nano-scale holes with a material of the nanowires. In particular, a mold or mask having holes is formed on a surface. The holes are then filled with a material that will become the nanowire. In some cases, the mold is removed to leave free-standing nanowires. In other instances, the mold (e.g., $SiO_2$) may remain. The composition of the material filling the holes may be varied along the length of the nanowire to form a heterostructure and/or a dopant material may be varied along the length to form a semiconductor junction (e.g., a p-n junction). In another example, nanowires are grown by self-assembly without a mold.

Nanowires may be grown using a variety of techniques. For example, catalyzed growth includes, but is not limited to, metal-catalyzed growth using one or more of a vapor-liquid-solid (VLS) technique and a vapor-solid (VS) technique, for example. A nanoparticle catalyst is formed on a surface from which the nanowire is to be grown. The growth may be performed in a chemical vapor deposition (CVD) chamber, for example, using a gas mixture comprising precursor nanowire materials and the assistance of the nanoparticle catalyst.

In particular, the nanoparticle catalyst accelerates decomposition of the precursor nanowire material in the gas mixture and atoms resulting from decomposition of a particular nanowire material-containing gas diffuse through or around the nanoparticle catalyst and precipitate on the underlying substrate. The atoms of the nanowire material precipitate between the nanoparticle catalyst and the surface to initiate nanowire growth. Moreover, catalyzed growth of the nanowire is continued with continued precipitation at the nanoparticle-nanowire interface. Such continued precipitation causes the nanoparticle to remain at the tip of the free end of the growing nanowire. The nanowire growth is continued until a targeted nanowire length is achieved. Other techniques, such as laser ablation for example, also may be used to supply the material forming the growing nanowire. The composition of the material forming the nanowire may be varied along the length of the nanowire to form an axial heterostructure or it may be varied in the radial direction to form a radial or "core-shell" heterostructure. The dopant concentration may be varied in magnitude or type to form an electrical junction (e.g., a p-n junction).

During catalytic growth, nanowires may grow from the location of the nanoparticle catalyst in a predominately perpendicular direction to a plane of a suitably oriented substrate surface. Under the most common growth conditions, nanowires grow in <111> directions with respect to a crystal lattice and therefore, grow predominately perpendicular to a (111) surface (of a crystal lattice). For (111)-oriented horizontal surfaces, a nanowire will grow predominately vertically relative to the horizontal surface. On (111)-oriented vertical surfaces, a nanowire will grow predominately laterally (i.e., horizontally) relative to the vertical surface.

The use of brackets '[ ]' herein in conjunction with such numbers as '111' and '110' pertains to a direction or orientation of a crystal lattice and is intended to include directions '<>' within its scope, for simplicity herein. The use of parenthesis '( )' herein with respect to such numbers as '111' and '110' pertains to a plane or a planar surface of a crystal lattice and is intended to include planes '{ }' within its scope for simplicity herein. Such uses are intended to follow common crystallographic nomenclature known in the art.

The terms 'semiconductor' and 'semiconductor materials' as used herein independently include, but are not limited to, group IV, group III-V and group II-VI semiconductor materials, including compound semiconductor materials, from the Periodic Table of the Elements, or another semiconductor material that forms any crystal orientation. For example, and not by way of limitation, a semiconductor substrate may be a silicon-on-insulator (SOI) wafer with a (111)- or (110)-oriented silicon layer (i.e., top layer), or a single, free-standing wafer of (111) silicon, depending on the embodiment. The semiconductor materials, whether part of a substrate or a nanowire, hat are rendered electrically conductive, according to some embodiments herein, are doped with a dopant material to impart a targeted amount of electrical conductivity (and possibly other characteristics) depending on the application.

An insulator or an insulator material useful for the various embodiments of the invention is any material that is capable of being made insulating including, but not limited to, a semiconductor material from the groups listed above, another semiconductor material, and an inherently insulating material. Moreover, the insulator material may be an oxide, a carbide, a nitride or an oxynitride of any of the above-referenced semiconductor materials such that insulating properties of the material are facilitated. For example, the insulator may be silicon oxide ($SiO_x$). Alternatively, the insulator mays comprise an oxide, a carbide, a nitride or an oxynitride of a metal (e.g., aluminum oxide) or even a combination of multiple, different materials to form a single insulating material or it may be formed from multiple layers of insulating materials.

A 'semiconductor junction' as used herein refers to a junction formed within a semiconductor material between two differently doped regions thereof. For example, a junction between a p-doped region and an n-doped region of the semiconductor material is referred to as a p-n semiconductor junction or simply a p-n junction. The p-n junction includes asymmetrically doped semiconductor junctions such as, but not limited to, $p^+$-n junctions where '$p^+$' denotes a relatively higher concentration of the p-type dopant compared to the n-type dopant. A semiconductor junction in which an intrinsically doped region (i-region or layer) lies between and separates the p-doped region and the n-doped region is generally referred to herein as a p-i-n semiconductor junction or simply a p-i-n junction. The term 'semiconductor junction' as used herein also refers to complex junctions that may include one or more of layers of different semiconductor materials (e.g., GaAs and GaAlAs), layers of different doping concentrations (e.g., p, $p^+$, $p^-$, $p^{++}$, n, $n^+$, $n^-$, $n^{++}$, i, etc.), and doping concentration gradients within and across layers. Junctions joining different semiconductor materials are typically referred to generically as either heterostructure junctions or simply heterojunctions. Herein, no distinction is made between various specific types of junctions (e.g., p-n, p-i-n, $p^+$-n, $p^{+-}$n, heterojunction, etc.) unless such distinction is necessary for proper understanding. Semiconductor junctions between an n-type semiconductor and a p-type semiconductor (of the same or of a different material) are also often referred to as 'diode junctions' and are the basis for many nanowire-based devices such as, but not limited to, light emitting diodes (LEDs), many semiconductor lasers, and diode photodetectors.

For simplicity herein, no distinction is made between a substrate and any layer or structure on the substrate unless such a distinction is necessary for proper understanding. Likewise, all semiconductor junctions are referred to generically unless a distinction is necessary for proper understanding. Further, as used herein, the article 'a' is intended to have its ordinary meaning in the patent arts, namely 'one or more'. For example, 'a nanowire' means one or more nanowires and as such, 'the nanowire' means 'the nanowire(s)' herein. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation.

FIG. 1 illustrates a side view of a nanowire-based device 100 according to an embodiment of the present invention. The nanowire-based device 100 comprises a semiconductor nanowire 110. The semiconductor nanowire 110 may comprise essentially any semiconductor material. For example, the semiconductor nanowire 110 may comprise silicon (Si). In another example, the semiconductor nanowire 110 may comprise one or more of gallium arsenide (GaAs), gallium aluminum arsenide (GaAlAs), and indium phosphide (InP).

The semiconductor nanowire 110 comprises a semiconductor junction 112. The semiconductor junction 112 may be essentially any semiconductor junction including, but not limited to, a p-n junction, a p-i-n junction and a heterojunction that includes either p-n junction or a p-i-n junction, as described above. In some embodiments, the semiconductor junction 112 is located axially along and within the semiconductor nanowire 110. For simplicity of discussion herein and not by way of limitation, the semiconductor junction 112 illustrated in FIG. 1 is described below with respect to FIGS. 2A, 2B, 3 and 4 in terms of a p-n junction. As illustrated therein, a p-doped region is labeled 'p' while an n-doped region is labeled 'n'.

The nanowire-based device 100 further comprises a residual carrier sink 120. In various embodiments, the residual carrier sink 120 is located either at or proximal to a surface of the nanowire. The residual carrier sink 120 facilitates removal of residual carriers from the semiconductor junction 112. In particular, in some embodiments residual carrier removal is provided by the residual carrier sink when the nanowire-based device 100 is switched off (i.e., when a stimulus condition is removed). In other embodiments, residual carrier removal is provided by the residual carrier sink when the stimulus condition (e.g., bias voltage) is reduced or changed. The residual carrier sink 120 removes residual carriers by one or both of enhanced recombination and direct extraction. When the nanowire-based device 100 is an optical emitter, residual carrier removal by the residual carrier sink 120 reduces a probability that the residual carriers will undergo radiative recombination within an active region of the semiconductor junction 112. When the nanowire-based device 100 is an optical detector, residual carrier removal by the residual carrier sink 120 reduces a probability that the residual carriers will contribute to a photocurrent of the optical detector. When the nanowire-based device 100 is an optical modulator, residual carrier removal reduces a probability that the residual carriers will interfere with modulation of the optical signal.

Figure 2A:
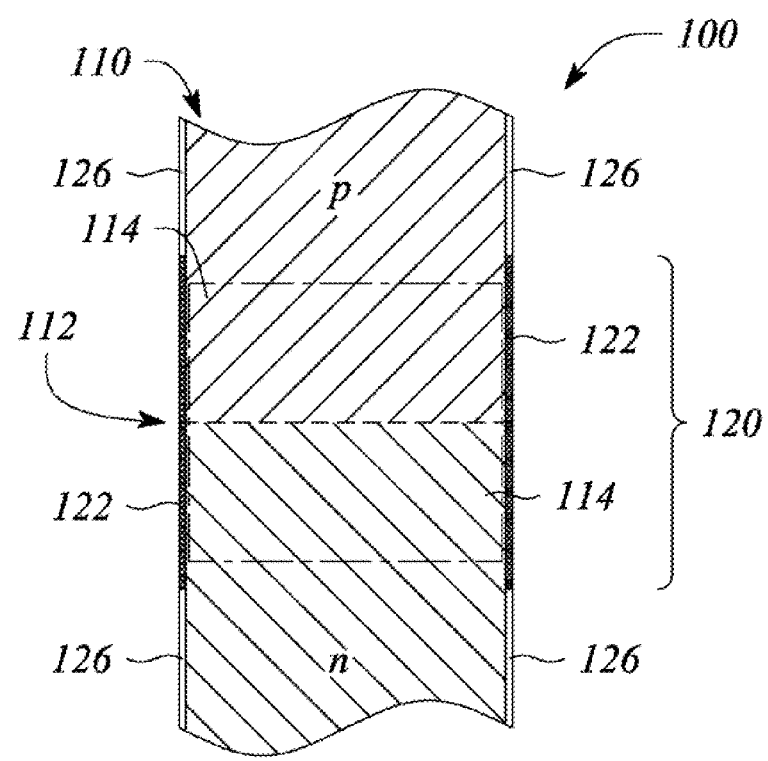
FIG. 2A illustrates an axial cross sectional view of a nanowire-based device according to an embodiment of the present invention.

FIG. 2A illustrates an axial cross sectional view of a nanowire-based device 100 according to an embodiment of the present invention. In particular, FIG. 2A illustrates the residual carrier sink 120 comprising a surface region 122 proximal to the semiconductor junction 112. The surface region 122 has enhanced surface state density, or equivalently interface state density, relative to a surface (or interface) state density of a material of the semiconductor nanowire 110 beyond or outside of the region 122. Herein, for convenience of discussion and not by way of limitation, the terms 'surface states' and 'surface state density' will be understood to explicitly include 'interface states' and 'interface state density', respectively, unless a distinction is necessary for proper understanding.

The enhanced state density yields an increased or enhanced surface recombination velocity within the surface region 122 when compared to a recombination velocity of the nanowire material beyond the region 122. The increased surface recombination velocity facilitates relatively rapid, recombination (both non-radiative and fast radiative) of residual carriers in the semiconductor junction 112. In particular, residual carriers rapidly diffuse to the surface region 122 due to the relatively short distance from an active region 114 of the semiconductor junction 112 to the surface region 122. Within the surface region 122, the residual carriers readily recombine as a result of the enhanced surface state density. As such, the surface region 122 having enhanced surface state density acts as the residual carrier sink to remove residual carriers from the semiconductor junction 112. The active region 114 is outlined by a dashed box in FIG. 2A.

In some embodiments, the surface region 122 having enhanced surface state density is confined to a relative short axial portion of an axial length of the semiconductor nanowire 110. For example, the short axial portion may be approximately the length of the active region of the semiconductor nanowire 110. Confining the surface region 122 to the relatively short portion may minimize an effect that the enhanced surface state density has on a performance of the nanowire-based device 100 when a stimulus condition is applied thereto (e.g., when the nanowire-based device 100 is switched on).

In some embodiments, the surface region 122 having enhanced surface state density comprises a native oxide on the surface of the semiconductor nanowire 110. The native oxide may be grown by atmospheric air exposure on the surface by first stripping a thermal oxide from the surface region 122 and then, exposing the stripped surface to an oxidizing atmosphere, such as air, at a low temperature, such as room temperature.

In some embodiments, the surface region 122 having enhanced surface state density is provided by damaging a surface of the semiconductor nanowire 110. In particular, the surface of the semiconductor nanowire 110 may be exposed to ultraviolet radiation to damage the interface between the semiconductor nanowire and the passivating layer (i.e., high-quality thermal oxide) or a plasma containing a relatively low energy species to disrupt a lattice of the semiconductor nanowire 110 at or near the surface thereof. Generally, confining lattice disruption adjacent to the surface means that the lattice within an active region of the semiconductor nanowire is essentially undisrupted. In such embodiments, the surface or interface region 122 is essentially an irradiated surface or interface region where the irradiation has disrupted the lattice or interface. Other known methods of increasing surface state density may also be employed to create the surface region 122 having enhanced surface state density.

Ideally, lattice disruption is controlled to be localized adjacent to the surface to minimize an effect that the disruption has on an 'ON' performance of the nanowire-based device 100. As used herein, 'ON' performance is an expected performance of the nanowire-based device 100 when in an 'ON' state. As such, 'ON' performance for an optical emitter might be an optical output power or an optical output efficiency of the nanowire-based device 100 when forward biased (i.e., when 'ON').

Figure 2B:
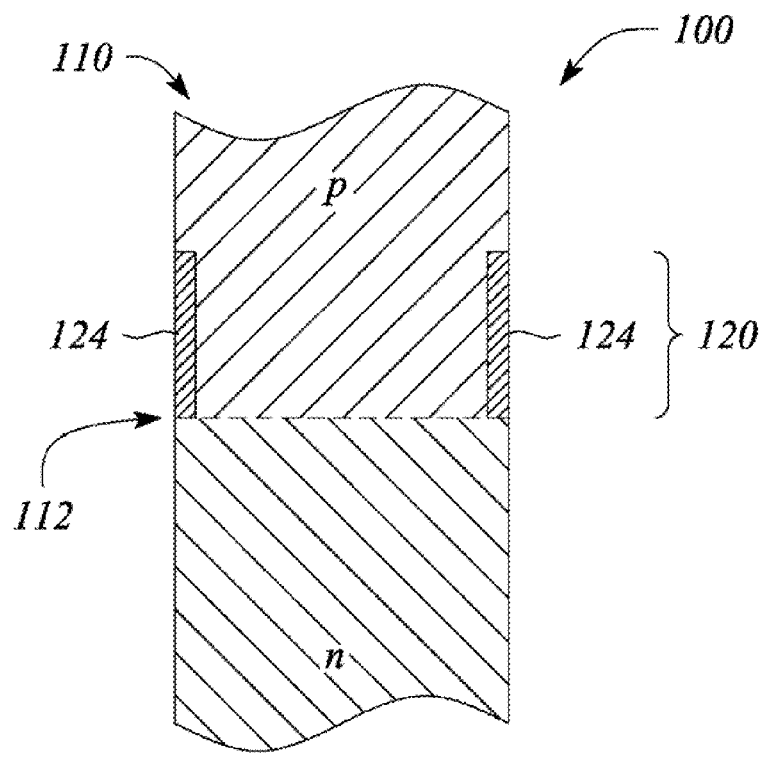
FIG. 2B illustrates an axial cross sectional view of a nanowire-based device according to another embodiment of the present invention.

FIG. 2B illustrates an axial cross sectional view of a nanowire-based device 100 according to another embodiment of the present invention. In particular, the residual carrier sink 120 illustrated in FIG. 2B comprises a heavily doped region 124 near a surface of the semiconductor nanowire 110. The heavily doped region 124 comprises a dopant concentration that is relatively higher than a doping concentration of the semiconductor material that makes the p-doped and/or n-doped regions of the semiconductor junction 112. That is, the heavily doped region 124 comprises a dopant having a higher concentration near the surface of the semiconductor nanowire relative to a dopant concentration nearer a center (e.g., active region) of the nanowire away from the surface. The dopant concentration may vary according to a concentration gradient or similar doping profile with distance from the surface. Herein, a high dopant concentration enables rapid recombination, in the most common case by providing a high density of free carriers to recombine with the residual carriers. Thus, for convenience in the present discussion, the definition of 'state' explicitly includes a dopant atom.

As illustrated in FIG. 2B, the heavily doped region 124 is restricted to a portion of the p-doped region of the semiconductor nanowire 110 and comprises a p-dopant having a higher concentration (e.g., $p^+$) than that of the remaining p-doped region. In other embodiments (not illustrated), the heavily doped region 124 may be on an n-doped side of the semiconductor junction 112 and comprises an n-dopant (e.g., $n^+$). In yet other embodiments (not illustrated), the residual carrier sink may comprise a heavily doped region that spans both the p-doped and n-doped sides of the semiconductor junction and has adjacent respective $p^+$ doped and n doped sides.

In the various embodiments, the dopant type (i.e., p or n) of the heavily doped region 124 is the same as the dopant type of the material of the adjacent region of the semiconductor junction. In some embodiments of the residual carrier sink, any of the embodiments described above of the heavily doped region 124 may be employed in addition to any of the embodiments described above of the surface region 122 having enhanced surface state density, according to some embodiments (not illustrated) of the present invention.

Referring again to FIG. 2A, the nanowire-based device 100 may further comprise another surface region 126 of the semiconductor nanowire 110, in some embodiments. The other surface region 126 has a surface state density that is relatively lower than the surface state density of the material of the semiconductor nanowire 110 within the region 122. The relatively lower surface state density of the other surface region 126 may enhance a performance of the nanowire-based device 100 when a stimulus condition is applied (i.e., when the nanowire-based device 100 is 'ON'). The other surface region 126 may be provided by a high-quality thermal oxide on the surface of the semiconductor nanowire 110. In general, the other surface region 126 does not overlap the surface region 122 having enhanced surface state density of the residual carrier sink 120. However, in embodiments of the residual carrier sink that comprises both an enhanced surface state density and a heavily doped region, another surface region having relatively lower surface state density may overlap the heavily doped region, according to some embodiments (not illustrated) of the present invention.

Figure 3:
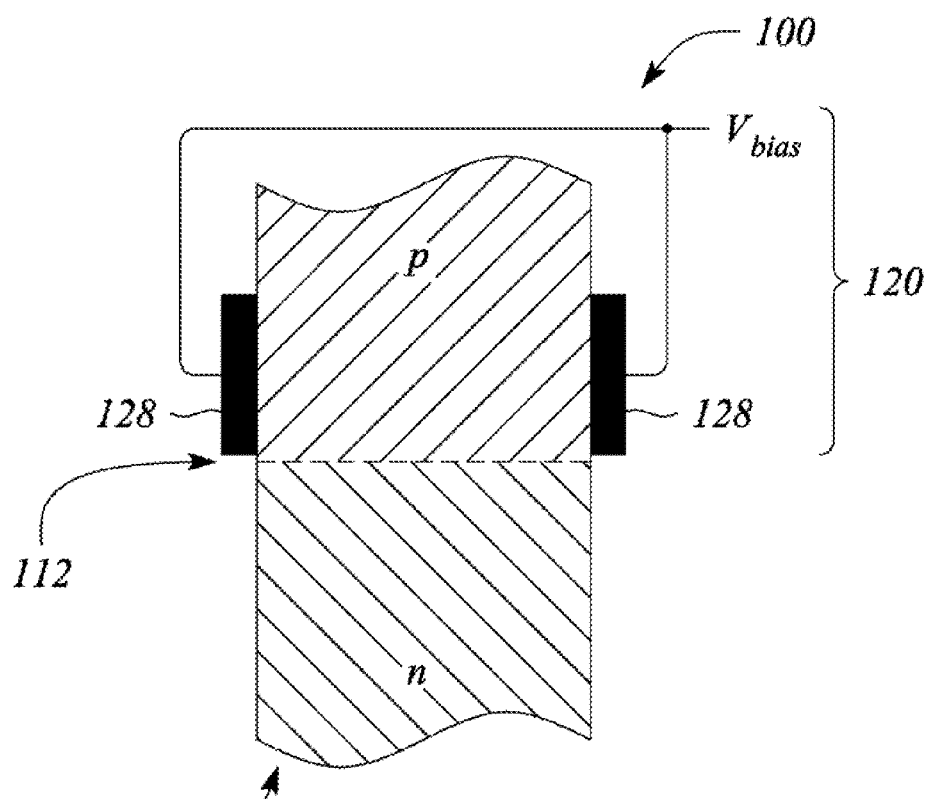
FIG. 3 illustrates an axial cross sectional view of a nanowire-based device according to another embodiment of the present invention.

FIG. 3 illustrates an axial cross sectional view of a nanowire-based device 100 according to another embodiment of the present invention. In particular, FIG. 3 illustrates a nanowire-based device 100 wherein the residual carrier sink 120 comprises an extraction electrode 128 adjacent to and in contact with a surface of the nanowire 110 proximal to the semiconductor junction 112. Further, the extraction electrode 128 is electrically biased to facilitate residual carrier extraction. For example, if the residual carriers are electrons, a positive electrical bias is employed to extract the electrons. The electrical bias ma, be provided by a bias voltage $V_{bias}$ as illustrated in FIG. 3, for example. In some embodiments, the electrical bias is switched on and off as the nanowire-based device 100 is switched off and on. In other words, the electrical bias applied to the extraction electrode 128 to extract residual carriers is synchronized to a modulation of the nanowire-based device 100. Other bias and bias modulation schemes can also be used.

As illustrated in FIG. 3, the extraction electrode 128 is connected to the p-doped side of the semiconductor junction 112. In other embodiments (not illustrated), the extraction electrode may be connected to the n-doped side. In yet other embodiments (not illustrated), a pair of extraction electrodes may, be employed, one extraction electrode of the pair being connected to each side of the semiconductor junction. In these embodiments, a different polarity electrical bias would be used for biasing extraction electrodes on opposite sides of the semiconductor junction.

Figure 4:
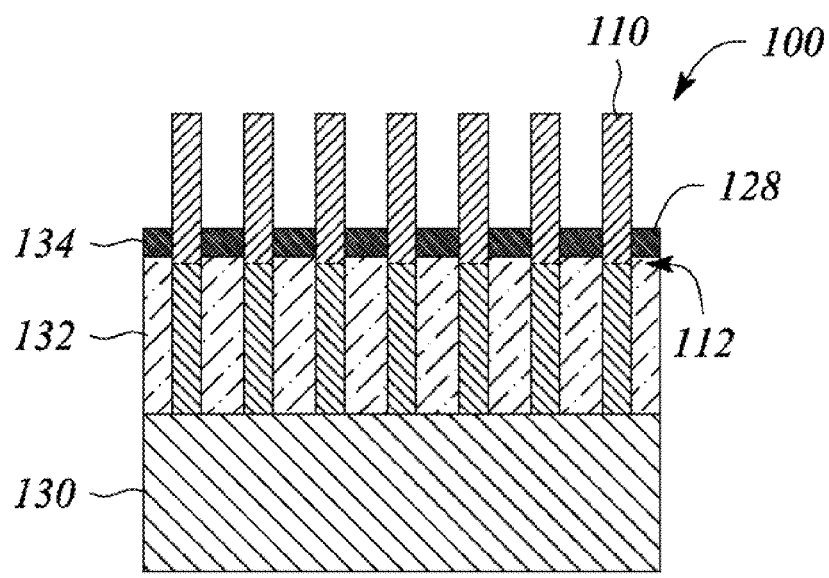
FIG. 4 illustrates a cross sectional view of an exemplary means for applying a metal to a surface of a plurality of semiconductor nanowires according to an embodiment of the present invention.

The extraction electrode 128 may comprise a metal or another conductor that is applied to the surface of the semiconductor nanowire 110. FIG. 4 illustrates a cross sectional view of an exemplar means for applying metal to a surface of a plurality of semiconductor nanowires 110 to form the extraction electrode 128, according to an embodiment of the present invention. As illustrated in FIG. 4, the nanowires 110 are first grown from a support substrate 130. In some embodiments, the support substrate 130 may also function as an electrical contact for the nanowires 110. Each nanowire 110 comprises a semiconductor junction 112 axially located along the length of the nanowire 110. An insulator layer 132 is applied to cover a portion of the semiconductor nanowires 110. The covered portion generally extends from a first end of the nanowire adjacent to the support substrate 130 to just above the semiconductor junction 112. A metal layer 134 is then deposited on the insulator layer 132. The metal layer 134 connects to the semiconductor nanowires 110 above the insulator layer 132 as well as above the semiconductor junction 112. Once connected, the metal layer 134 becomes the extraction electrode 128. In some embodiments, the metal layer 134 may be further processed. For example, the metal layer 132 may be etched to create separate ones of the extraction electrodes 128 for particular ones of the nanowires 110 in the plurality. In some embodiments, the insulator layer 132 may be subsequently removed. In some embodiments (not illustrated), separate extraction electrodes may be provided above and below the semiconductor junction using more than one metal layer, for example.

In some embodiments of the residual carrier sink (not illustrated), a heavily doped region may be employed in addition to the extraction electrode. The heavily doped region may be substantially similar to any of the embodiments of the heavily doped region 124 described above with respect to FIG. 2B. In some embodiments, the heavily doped region facilitates good electrical connection between the extraction electrode and the semiconductor material of the nanowire 110. In such embodiments, the heavily doped region is usually located Within the semiconductor nanowire at a contact point of the extraction electrode.

Figure 5:
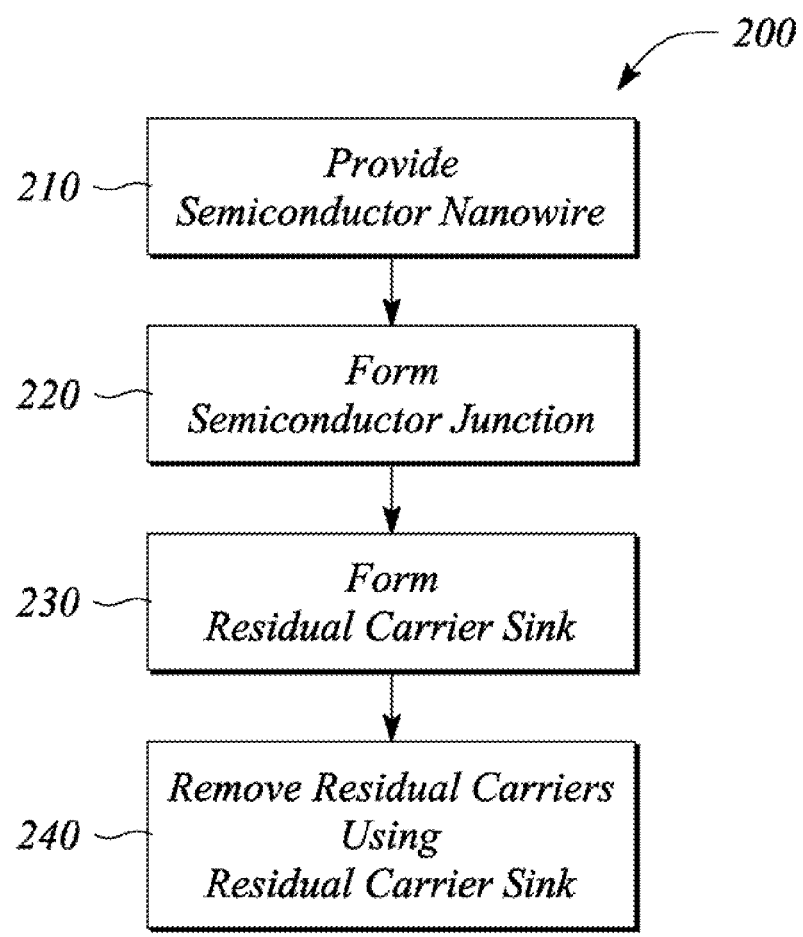
FIG. 5 illustrates a flow chart of a method of residual carrier removal in a nanowire-based nanowire-based device according to an embodiment of the present invention.

FIG. 5 illustrates a flow chart of a method 200 of residual carrier removal in a nanowire-based device according to an embodiment of the present invention. The method 200 of residual carrier removal comprises providing 210 a semiconductor nanowire. For example, the semiconductor nanowire may be grown on a surface of a substrate using metal-catalyzed growth according to one or both of the vapor-liquid-solid (VLS) technique and the vapor-solid (VS) technique.

The method 200 of residual carrier removal further comprises forming 220 a semiconductor junction within the semiconductor nanowire. According to some embodiments, the semiconductor junction may be formed 220 in situ during nanowire growth. For example, a dopant-containing material may be added to the vapor material of the VLS or VS technique to dope the semiconductor nanowire. The semiconductor junction is formed 220 in situ by changing the dopant type (e.g., from p-type to n-type) by changing the dopant-containing material in the vapor material as growth proceeds. Alternatively, the dopant may be selectively introduced after growth to either form 220 or finish forming 220 the semiconductor junction. Various conventional techniques such as, but not limited to, ion implantation may be employed to selectively introduce one or more dopants into the semiconductor nanowire.

The method 200 of residual carrier removal further comprises forming 230 a residual carrier sink. The residual carrier sink is formed 230 proximal to the semiconductor junction and adjacent to a surface of the semiconductor nanowire.

In some embodiments, forming 230 a residual carrier sink comprises providing a surface region (i.e., a region of a primary surface) on the nanowire proximal to the semiconductor junction. The surface region comprises an enhanced state density compared to a state density of the semiconductor nanowire outside of the residual carrier sink surface region. In some embodiments, providing a surface region on the nanowire comprises one or more of applying a native oxide the surface region, subjecting the surface region to plasma containing a low energy species, and irradiating the surface region with ultraviolet radiation, such that a surface layer and/or interface region of the surface region is disrupted. All of these methods of applying may be generally referred to as radiative-disruption of the semiconductor nanowire wherein the disruption is essentially confined to a surface layer.

In other embodiments, forming 230 a residual carrier sink comprises providing an electrode on and in electrical contact with a surface of the nanowire in the vicinity of the semiconductor junction. The electrode may be provided by depositing a metal layer on the surface of the nanowire preferably after any oxide has been removed from the surface, for example. The electrode may be referred to as an extraction electrode.

In yet other embodiments, forming 230 comprises providing a heavily doped region adjacent to a surface of the semiconductor nanowire proximal to the semiconductor junction. The heavily doped region comprises a dopant concentration that is higher than a dopant concentration of an active region of the semiconductor junction.

The method 200 of residual carrier removal further comprises removing 240 residual carriers from the semiconductor junction using a residual carrier sink. Removing 240 residual carriers is performed after the nanowire-based device is switched off. Removing 240 uses one or both of enhanced recombination and biased residual carrier extraction. Enhanced recombination may include one or both of non-radiative and fast radiative recombination, according to various embodiments.

In particular, when provided, the enhanced surface state density region acts as the residual carrier sink to attract and eliminate residual carriers from the semiconductor junction during removing 240. Elimination may be by essentially non-radiative recombination, for example, but may also include various fast radiative processes. Similarly, when a heavily doped region is provided, the heavy doping promotes non-radiative recombination to facilitate removing 240. Non-radiative recombination may be by Auger recombination, for example.

In embodiments using the provided electrode, removing 240 residual carriers comprises applying a bias to the electrode, the bias having a polarity opposite that of a charge of the residual carriers. The biased electrode acts as the residual carrier sink to attract and remove residual carriers by direct extraction from the semiconductor junction. In particular, the biased electrode may absorb residual carriers to directly extract them from the semiconductor nanowire.

Thus, there have been described embodiments of a nanowire-based device and a method that facilitate removal of residual carriers from a semiconductor junction of the nanowire-based device. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A nanowire-based-device comprising:
a semiconductor nanowire having a semiconductor junction; and
a residual carrier sink, the residual carrier sink being adjacent to a surface of the nanowire proximal to the semiconductor junction,
wherein the residual carrier sink facilitates removal of residual carriers from the semiconductor junction using one or both enhanced recombination and direct extraction of residual carriers, the nanowire-based device being one of an optical detector and an optical modulator.

2. The nanowire-based device of claim 1, wherein the nanowire-based device further comprises an optical emitter, the residual carriers being free carriers that remain near the semiconductor junction after a forward bias current is one of reduced or switched off, the removal reducing a probability that the residual carriers will undergo radiative recombination within an active region of the semiconductor junction.

3. The nanowire-based device of claim 1, wherein when the nanowire-based device is an optical detector, the residual carriers being free carriers created by an incident optical signal that remain near the semiconductor junction after the incident optical signal is one of reduced or switched off, the removal reducing a probability that the residual carriers will contribute to a photocurrent of the optical detector.

4. The nanowire-based device of claim 1, wherein when the nanowire-based device is an optical modulator, the residual carriers being free carriers within an active region of the semiconductor junction that remain after an electrical modulation control signal is reduced, the removal reducing a probability that the residual carriers will affect an optical signal passing through the semiconductor junction.

5. The nanowire-based device of claim 1, wherein the semiconductor junction is one of a p-n junction, p-i-n junction and a heterojunction that includes either a p-n junction or a p-i-n junction.

6. The nanowire-based device of claim 1, wherein the residual carrier sink comprises a region adjacent to a surface of the semiconductor nanowire, the region having enhanced state density relative to a state density of the nanowire outside of the region, the enhanced state density providing the enhanced recombination.

7. The nanowire-based device of claim 6, wherein the region having enhanced state density comprises a native oxide on a surface of the nanowire adjacent to the semiconductor junction.

8. The nanowire-based device of claim 6, wherein the region having enhanced state density comprises a radiation-disrupted surface region of the semiconductor nanowire adjacent to the semiconductor junction.

9. The nanowire-based device of claim 6, wherein the region having enhanced state density comprises a dopant, a concentration of the dopant being higher near the surface of the semiconductor nanowire relative to a dopant concentration near a center of the semiconductor nanowire, the center being internal to the surface.

10. The nanowire-based device of claim 1, wherein the residual carrier sink comprises an extraction electrode in contact with a surface of the semiconductor nanowire proximal to the semiconductor junction, the extraction electrode being electrically biased to facilitate residual carrier extraction.

11. The nanowire-based device of claim 10, wherein the residual carrier sink further comprises a heavily doped region between the extraction electrode and an active region of the semiconductor junction, the heavily doped region being adjacent to the surface of the semiconductor nanowire, the heavily doped region comprising a dopant that has a concentration that is higher than a doping concentration of the active region.

12. A nanowire-based semiconductor device comprising:
a nanowire comprising a semiconductor material, the semiconductor material comprising a plurality of dopants that forms a semiconductor junction, the semiconductor junction being axially located within the nanowire; and
a residual carrier sink proximal to the semiconductor junction, the residual carrier sink comprising a region of the nanowire either at or adjacent to a surface of the nanowire, the region having enhanced state density relative to a state density of the semiconductor material of the nanowire outside of the region, wherein the residual carrier sink facilitates removal of residual carriers from the semiconductor junction.

13. The nanowire-based semiconductor device of claim 12, wherein the nanowire-based semiconductor device is an optical emitter.

14. The nanowire-based semiconductor device of claim 12, wherein the nanowire-based semiconductor device is an optical detector.

15. The nanowire-based semiconductor device of claim 12, wherein the nanowire-based semiconductor device is an optical modulator.

16. A method of residual carrier removal in a nanowire-based device, the method comprising:

providing a semiconductor nanowire;

forming a semiconductor junction within the semiconductor nanowire;

forming a residual carrier sink proximal to the semiconductor junction adjacent to a surface of the semiconductor nanowire; and removing residual carriers from the semiconductor junction using the residual carrier sink, wherein removing residual carriers using the residual carrier sink employs one or both of enhanced recombination and biased residual carrier extraction, and wherein the nanowire-based device is one of an optical detector and an optical modulator.

17. The method of residual carrier removal of claim 16, wherein forming a residual carrier sink comprises providing a surface region on the nanowire proximal to the semiconductor junction, the surface region comprising an enhanced state density compared to a state density of the semiconductor nanowire outside the region, the enhanced state density acting as the residual carrier sink to attract and eliminate residual carriers from the semiconductor junction by enhanced recombination.

18. The method of residual carrier removal of claim 17, wherein providing a surface region on the nanowire comprises one or more of forming a native oxide on the surface region, subjecting the surface region to plasma containing a low energy species, and irradiating the surface region with ultraviolet radiation, such that a layer near the surface is disrupted.

19. The method of residual carrier removal of claim 16, wherein forming a residual carrier sink comprises providing an electrode on and in electrical contact with a surface of the nanowire in the vicinity, of the semiconductor junction and, wherein removing residual carriers comprises applying a bias to the electrode having a polarity opposite that of a charge of the residual carriers, the applied bias acting as the residual carrier sink to attract and remove residual carriers by direct extraction from the semiconductor junction.

20. The method of residual carrier removal of claim 16, wherein forming a residual carrier sink comprises providing a heavily doped region adjacent to a surface of the semiconductor nanowire proximal to the semiconductor junction, wherein the heavily doped region facilitates enhanced recombination of the residual carriers during removing.

* * * * *

UNITED STATES PATENT AND TRADEMARK OFFICE
CERTIFICATE OF CORRECTION

PATENT NO. : 8,148,800 B2  
APPLICATION NO. : 12/243182  
DATED : April 3, 2012  
INVENTOR(S) : Theodore I. Kamins Page 1 of 1

It is certified that error appears in the above-identified patent and that said Letters Patent is hereby corrected as shown below:

In column 13, line 56, in Claim 1, delete "based-device" and insert -- based device --, therefor.

In column 16, line 18, in Claim 19, delete "vicinity," and insert -- vicinity --, therefor.

Signed and Sealed this
Eighth Day of January, 2013

David J. Kappos
*Director of the United States Patent and Trademark Office*